United States Patent
Feyh

(10) Patent No.: US 8,163,585 B2
(45) Date of Patent: Apr. 24, 2012

(54) METHOD FOR MANUFACTURING A SENSOR ELEMENT, AND SENSOR ELEMENT

(75) Inventor: Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 110 days.

(21) Appl. No.: 12/308,239

(22) PCT Filed: Jun. 11, 2007

(86) PCT No.: PCT/EP2007/055696
§ 371 (c)(1),
(2), (4) Date: Apr. 27, 2009

(87) PCT Pub. No.: WO2008/006651
PCT Pub. Date: Jan. 17, 2008

(65) Prior Publication Data
US 2009/0294880 A1    Dec. 3, 2009

(30) Foreign Application Priority Data
Jul. 10, 2006   (DE) .......................... 10 2006 031 772

(51) Int. Cl.
*H01L 21/00* (2006.01)

(52) U.S. Cl. ............ 438/52; 73/514.16; 73/754; 73/777

(58) Field of Classification Search ............. 438/50–53; 73/514.16, 754, 777
See application file for complete search history.

(56) References Cited

U.S. PATENT DOCUMENTS

| | | | |
|---|---|---|---|
| 5,922,212 A * | 7/1999 | Kano et al. ........................ 216/2 |
| 7,244,657 B2 * | 7/2007 | Ogihara et al. ............... 438/409 |
| 2003/0183916 A1 | 10/2003 | Heck et al. |
| 2004/0245586 A1 | 12/2004 | Partridge et al. |
| 2005/0025215 A1 | 2/2005 | Arndt et al. |

FOREIGN PATENT DOCUMENTS

| | | |
|---|---|---|
| DE | 101 04 868 | 8/2002 |
| EP | 1 108 677 | 6/2001 |
| EP | 1 640 320 | 3/2006 |
| EP | 1 640 324 | 3/2006 |

* cited by examiner

*Primary Examiner* — Richard A. Booth
(74) *Attorney, Agent, or Firm* — Kenyon & Kenyon LLP

(57) ABSTRACT

A method for manufacturing a capped sensor element by providing a substrate with a sensor structure, the sensor structure being produced in the substrate using a sacrificial material, applying a cap made of zeolite to the sensor structure and the sacrificial material, and removing the sacrificial material, the sacrificial material being removed through the cap made of zeolite. A sensor element having capping is also provided.

17 Claims, 1 Drawing Sheet

METHOD FOR MANUFACTURING A SENSOR ELEMENT, AND SENSOR ELEMENT

FIELD OF THE INVENTION

The present invention relates to a method for manufacturing a sensor element having a capping, and such a sensor element.

BACKGROUND INFORMATION

Sensor elements having cappings are discussed in DE 101 04 868 A1, for example. The cited document discloses a capping using a bonding glass, thereby making better use of a wafer for manufacturing sensor elements.

As to the use of so-called cap wafers for the capping, this method has the disadvantage that two wafers are required for manufacturing the sensor element, which correspondingly increases the manufacturing costs.

SUMMARY OF THE INVENTION

In contrast, the method according to the present invention for manufacturing a sensor element having a capping has the advantage that it may be carried out in a particularly economical manner. Thus, according to the present invention the manufacturing costs for sensor elements having capping may be significantly reduced. According to the present invention, the method includes the following steps: providing a substrate with a sensor structure, the sensor structure being produced in the substrate using a sacrificial material. A capping made of zeolite is then applied to the sensor structure and the sacrificial material still in the substrate. As the next step the sacrificial material is removed, the removal of the sacrificial material occurring through the zeolite. To avoid contamination or destruction of the sensor structure by the zeolite applied as capping, the sacrificial material is not removed until the zeolite capping is provided.

Further exemplary refinements of the present invention are also described herein.

A zeolite from the group of alumosilicates may be used as zeolite.

The zeolite for the capping may be applied using a suspension. In a subsequent step the suspension is dried so that the zeolite remains on the substrate.

According to one exemplary embodiment of the present invention, the sacrificial material is removed in a gas phase process using an etching gas. This process may be carried out in a particularly simple and economical manner. $ClF_3$ gas and/or HF vapor may particularly be used as the etching gas.

To allow the sacrificial material to be removed as easily as possible, the sacrificial material may include Si, SiGe, or $SiO_2$.

The zeolite may particularly be applied in such a way that the zeolite has a defined pore size. In this manner, desired characteristics of the sensor element to be produced may be achieved as a function of the intended purpose of the sensor element. The pore size of the zeolite may be between approximately 1 nm and approximately 1 µm. The pore size particularly may be smaller than 100 nm.

A protective layer may also be applied to the zeolite. In this manner the zeolite as well as the sensor structure situated therebeneath may be protected. The protective layer may be gas-tight, thereby completely sealing the zeolite. In this case it may particularly be the case that the pore size of the zeolite is very small. In addition, a desired atmosphere may be enclosed in the region of the sensor structure. Alternatively, the protective layer may be gas-permeable in a defined manner when the sensor structure is designed, for example, to detect specific gases.

The protective layer may be applied to the zeolite using a sputtering method or CVD method, in particular a plasma-enhanced chemical vapor deposition (PECVD) method. In this case a layer thickness may be between 10 nm and 100 nm.

It is noted that micromechanical sensor elements in particular may be capped using the method according to the present invention.

The present invention further relates to a sensor element which includes a substrate, a sensor structure, and a capping, the capping being produced from zeolite and provided over the sensor structure. The capping thus covers and protects the sensor structure.

The capping particularly may have a uniform thickness over the sensor structure.

The sensor structure for the sensor element according to the present invention may include a plurality of finger elements which at one end is fixed to the substrate and at the other end is exposed. In this manner, for example, movements of the finger elements may be detected by the sensor structure.

The sensor element also may include a coating which is provided over the zeolite capping. The coating may have a gas-tight design, for example. The coating may also have a protective function for the zeolite and/or the sensor structure. Alternatively, the coating may be gas-permeable in a defined manner, the coating having pores with predetermined maximum cross-sectional openings. The thickness of the coating may be between 10 nm and 100 nm. A permeable coating is used in particular for gas sensors.

A gas-tight coating is used, for example, for inertial sensors for use in vehicles.

Exemplary embodiments of the present invention are described below with reference to the accompanying drawings.

DETAILED DESCRIPTION

Exemplary embodiments of the present invention are explained in greater detail below with reference to the accompanying figures.

Figure 1:
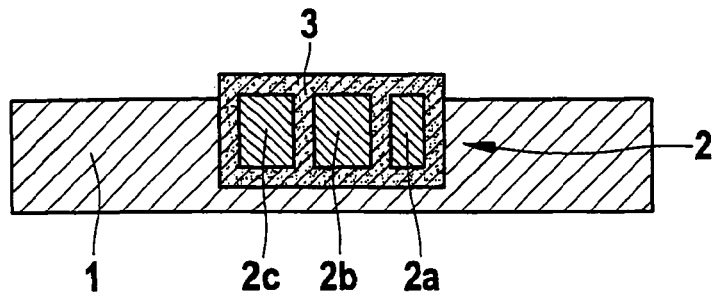
FIG. 1 illustrates a schematic sectional view showing the production of a sensor structure using a sacrificial material.

In a first step the method according to the present invention includes providing a substrate 1 with a sensor structure 2. As shown in FIG. 1, sensor structure 2 is introduced into substrate 1 using a sacrificial material 3. Sensor structure 2 in this exemplary embodiment has three sensor elements 2a, 2b, 2c, in each case one end thereof being fixed to substrate 1 and the other end being free. SiGe, for example, is used as a sacrificial material, which may be removed using a gas phase process.

Figure 2:
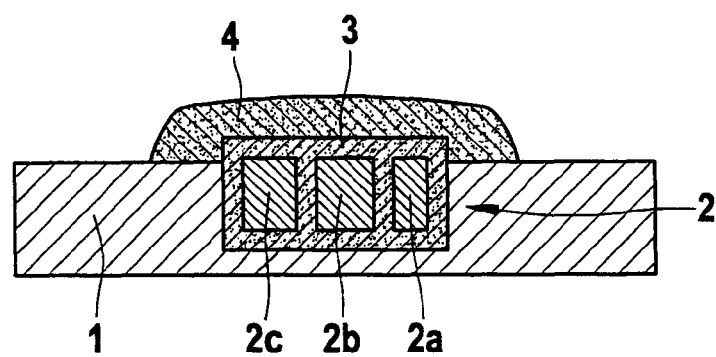
FIG. 2 illustrates a schematic sectional view showing the sensor element after application of the capping.

After sensor structure 2 is produced, as shown in FIG. 2, in a subsequent step a cap or capping 4 is applied over sensor structure 2 and sacrificial material 3. Capping 4 may be applied, for example, using a suspension, followed by drying. Capping 4 encloses sensor structure 2 in such a way that the sensor structure is isolated from its surroundings. Capping 4 is made of a zeolite, it being possible to set the pore size of the zeolite in a defined manner. The zeolite may be composed of aluminum and silicon. The zeolite is thus compatible with common semiconductor processes.

After the zeolite capping has been applied and dried, in a subsequent step sacrificial material 3 is removed. This is carried out using gas phase etching. A specialized etching gas, for example ClF$_3$ or HF vapor, is used, depending on the sacrificial material used. After sacrificial material 3 has been removed, three finger elements 2a, 2b, 2c are exposed in substrate 1. A cavity between finger elements 2a, 2b, 2c of sensor structure 2 is represented by reference numeral 5 in FIG. 3.

The use of the zeolite has the further advantage that the zeolite is compatible with semiconductors, thus allowing use to be made of the corresponding processes and equipment which are already used for manufacturing the sensor structure. The sensor element according to the present invention may thus be produced in a very simple manner. The morphology of the zeolite may be set in a very defined manner, it being possible to set the pore size as well as a pore structure or degree of branching of the pore structure.

As a result of the zeolite having the pore structure, sacrificial material 3 may be removed through the zeolite. In particular wet chemical etching is dispensed with, since during drying, so-called "sticking" may occur in which the finger elements may adhere to the substrate.

Figure 3:
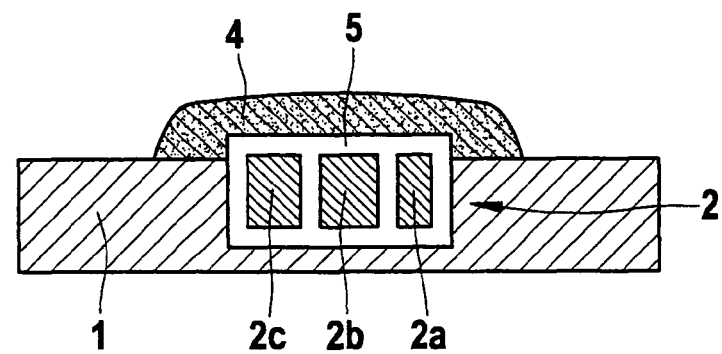
FIG. 3 illustrates a schematic sectional view showing the sensor element after removal of the sacrificial material.

A sensor element such as the one shown in FIG. 3 may be used as a gas sensor, for example. In this case the zeolite is gas-permeable, thus allowing the corresponding gas to flow to sensor structure 2.

Figure 4:
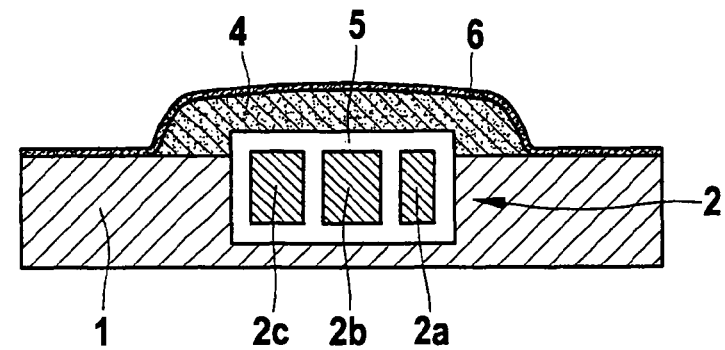
FIG. 4 illustrates a schematic sectional view showing a further method step for applying a coating.

In FIG. 4 an alternative further method step is illustrated, showing the application of an additional coating 6. Coating 6 has a protective function for zeolite 4 and may also perform other functions. For example, coating 6 may have a gas-tight design, so that sensor structure 2 is provided gas-tight in substrate 1. In addition, a desired gas may be enclosed in cavity 5 in the region of sensor structure 2. It is noted that when a coating 6 is applied, the pore size of the zeolite may be selected to be as small as possible, for example between approximately 10 nm and 100 nm, thus allowing the zeolite structure to be easily sealed. Sputtering methods or PECVD methods, for example, may be used as layer deposition methods. Such a sensor may be used as an inertial sensor, for example.

Thus, according to the present invention a particularly economical capping of sensor elements using a zeolite 4 is described. In particular, the equipment and processes present in the semiconductor process may be used, thereby making it possible to significantly reduce the cost of manufacturing capped sensor elements.

What is claimed is:

1. A method for manufacturing a capped sensor element, the method comprising:
   providing a substrate with a sensor structure, the sensor structure having a plurality of finger elements, the sensor structure being produced in the substrate using a sacrificial material, the sacrificial material deposited between each finger element;
   applying a cap made of zeolite to the sensor structure and the sacrificial material; and
   removing the sacrificial material through the cap made of zeolite.

2. The method of claim 1, wherein the zeolite is applied using a suspension, followed by a drying operation to deposit the zeolite.

3. The method of claim 1, wherein the sacrificial material is removed in a gas phase process using an etching gas.

4. The method of claim 3, wherein the etching gas is one of a ClF$_3$ gas and an HF vapor.

5. The method of claim 1, wherein the sacrificial material includes silicon or is produced from SiGe or SiO$_2$.

6. The method of claim 1, wherein the zeolite for the cap has a defined pore size.

7. The method of claim 6, wherein the pore size of the zeolite for the cap is between approximately 1 nm and approximately 1 μm.

8. The method of claim 1, wherein a protective layer is applied to the cap.

9. The method of claim 8, wherein the protective layer is gas-tight or is gas-permeable in a defined manner.

10. The method of claim 8, wherein the protective layer is applied using sputtering or PECVD.

11. The method of claim 1, wherein a zeolite from the group of alumosilicates is used as the zeolite.

12. A sensor element comprising:
   a substrate;
   a sensor structure, the sensor structure having a plurality of finger elements, the sensor structure being produced in the substrate using a sacrificial material, the sacrificial material deposited between each finger element; and
   a cap produced from zeolite and provided over the sensor structure,
   wherein each finger element has a first end fixed to the substrate and a second free end.

13. The sensor element of claim 12, further comprising:
   a coating provided over the cap.

14. The method of claim 1, wherein each finger element has a first end fixed to the substrate and a second free end.

15. A method for manufacturing a capped sensor element, the method comprising:
   providing a substrate with a sensor structure, the sensor structure having a plurality of finger elements, the sensor structure being produced in the substrate using a sacrificial material, the sacrificial material deposited between each finger element;
   applying a cap made of zeolite to the sensor structure and the sacrificial material; and
   removing the sacrificial material through the cap made of zeolite,
   wherein a protective layer is applied to the cap,
   wherein the protective layer is gas-tight.

16. A sensor element comprising:
   a substrate;
   a sensor structure, the sensor structure having a plurality of finger elements, the sensor structure being produced in the substrate using a sacrificial material, the sacrificial material deposited between each finger element; and
   a cap produced from zeolite and provided over the sensor structure,
   wherein a protective layer is applied to the cap,
   wherein the protective layer is gas-tight,
   wherein each finger element has a first end fixed to the substrate and a second free end.

17. The method of claim 7, wherein the pore size of the zeolite for the cap is smaller than 100 nm.

* * * * *